(12) United States Patent
Nabeta

(10) Patent No.: US 7,956,528 B2
(45) Date of Patent: Jun. 7, 2011

(54) ORGANIC ELECTROLUMINESCENT DEVICE COMPRISING CERAMIC SHEET AND GRAPHITE SHEET

(75) Inventor: Toshiyuki Nabeta, Minami-Ashigara (JP)

(73) Assignee: Fujifilm Corporation, Tokyo (JP)

( * ) Notice: Subject to any disclaimer, the term of this patent is extended or adjusted under 35 U.S.C. 154(b) by 348 days.

(21) Appl. No.: 11/377,275

(22) Filed: Mar. 17, 2006

(65) Prior Publication Data

US 2006/0207649 A1    Sep. 21, 2006

(30) Foreign Application Priority Data

Mar. 18, 2005   (JP) ............................. P.2005-080116

(51) Int. Cl.
*H01L 51/00* (2006.01)
*H05B 33/12* (2006.01)
(52) U.S. Cl. ............................ 313/504; 313/512; 313/46
(58) Field of Classification Search .................. 313/512, 313/506, 504, 46
See application file for complete search history.

(56) References Cited

U.S. PATENT DOCUMENTS

| | | | |
|---|---|---|---|
| 7,495,390 B2 * | 2/2009 | Park et al. ............... | 313/512 |
| 2003/0025118 A1 | 2/2003 | Yamazaki et al. | |
| 2003/0129790 A1 * | 7/2003 | Yamazaki et al. ............ | 438/149 |
| 2004/0061437 A1 | 4/2004 | Ikagawa | |
| 2004/0145645 A1 | 7/2004 | Gyoutoku et al. | |
| 2005/0158580 A1 * | 7/2005 | Ito et al. ................. | 428/690 |
| 2005/0271840 A1 * | 12/2005 | Frank ..................... | 428/35.7 |
| 2005/0286580 A1 * | 12/2005 | Oka ...................... | 372/36 |
| 2006/0027817 A1 | 2/2006 | Yamazaki et al. | |
| 2006/0035085 A1 | 2/2006 | Ozaki et al. | |
| 2006/0159840 A1 | 7/2006 | Ikagawa | |
| 2006/0170341 A1 * | 8/2006 | Su et al. .................. | 313/512 |
| 2006/0290768 A1 | 12/2006 | Gyoutoku et al. | |
| 2007/0259186 A1 | 11/2007 | Ozaki et al. | |
| 2009/0302339 A1 | 12/2009 | Yamazaki et al. | |

FOREIGN PATENT DOCUMENTS

| | | |
|---|---|---|
| JP | 10-106746 A | 4/1998 |
| JP | 10-275681 A | 10/1998 |
| JP | 2003-7450 A | 1/2003 |
| JP | 2003-59644 A | 2/2003 |
| JP | 2003-109773 A | 4/2003 |
| JP | 2003-306617 A | 10/2003 |
| JP | 2003-309383 A | 10/2003 |
| JP | 2004-119317 A | 4/2004 |
| JP | 2004-195963 A | 7/2004 |
| JP | 2006-244846 A | 9/2006 |
| WO | WO 2004/109797 A1 | 12/2004 |
| WO | WO 2005/019132 A1 | 3/2005 |

OTHER PUBLICATIONS

Japanese Office Action No. 2005-060116 issued Jan. 20, 2010.
Decision of Refusal dated Aug. 3, 2010 for Japanese Application No. 2005-080116.

* cited by examiner

*Primary Examiner* — Karabi Guharay
(74) *Attorney, Agent, or Firm* — Birch, Stewart, Kolasch & Birch, LLP

(57) ABSTRACT

An organic electroluminescent device is provided and includes: electrodes containing a back electrode and a transparent electrode; and a light-emitting layer disposed between the electrodes. On a side of the back electrode opposite to the light-emitting layer, a ceramic sheet having a thermal emissivity of 0.8 or more and a thickness of from 50 to 1,000 μm or a graphite sheet having a thermal conductivity of 200 W/m·K or more is provided, or the graphite sheet and the ceramic sheet adjacent thereto are provided.

5 Claims, 2 Drawing Sheets

ORGANIC ELECTROLUMINESCENT DEVICE COMPRISING CERAMIC SHEET AND GRAPHITE SHEET

FIELD OF THE INVENTION

The present invention relates to an organic electroluminescent device emitting light through conversion of electric energy to light.

BACKGROUND OF THE INVENTION

A planar light-emitting apparatus using an organic electroluminescent device is expected to have such applications as an ordinary illumination light source, a special illumination light source for art galleries and museums, and a backlight for an LCD, but has not yet reach full-fledged practical use. One of the major causes thereof is decrease in luminescence lifetime due to heat generation of the organic electroluminescent device itself.

Such an electroluminescent device is disclosed that has a pair of electrode on a substrate and a luminescent band provided between the electrodes, and also has a graphite sheet in contact with a surface of the substrate opposite to the pair of electrodes (for example, in JP-A-2003-59644), and in the device, heat formed on luminescence is radiated and uniformized by providing the graphite sheet.

SUMMARY OF THE INVENTION

An object of an illustrative, non-limiting embodiment of the invention is to provide such an organic electroluminescent device, which has a novel structure and is capable of emitting light with high luminance for a long period of time by suppressing the device from being deteriorated due to heat generation.

In the invention, a ceramic sheet or a graphite sheet having a high thermal emissivity is provided on a side of a back electrode opposite to a light-emitting layer, and a transparent electroconductive film having a transparent electroconductive film part and a fine wire structure of a metal, which includes alloys, is used, whereby heat formed on luminescence is radiated to attain a long lifetime of an organic electroluminescent device. The aforementioned and other objects of the invention are accomplished by the organic electroluminescent device.

The invention includes the following aspects.

1. An organic electroluminescent device containing: a back electrode; at least one transparent electrode; at least one light-emitting layer between the back electrode and the at least one transparent electrode; and a ceramic sheet having a thermal emissivity of 0.8 or more and a thickness of 50 to 1,000 μm, disposed on a side of the back electrode opposite to the at least one light-emitting layer (the ceramic sheet being between the back electrode and the at least one light-emitting layer).

2. An organic electroluminescent device containing: a back electrode; at least one transparent electrode; at least one light-emitting layer between the back electrode and the at least one transparent electrode; and a graphite sheet having a thermal conductivity of 200 W/m·K or more, disposed on a side of the back electrode opposite to the light-emitting layer (the graphite sheet being between the back electrode and the at least one light-emitting layer).

3. An organic electroluminescent device containing: a back electrode; at least one transparent electrode; at least one light-emitting layer between the back electrode and the at least one transparent electrode; a graphite sheet having a thermal conductivity of 200 W/m·K or more, the graphite sheet being disposed on a side of the back electrode opposite to the at least one light-emitting layer and adjacent to the back electrode; and a ceramic sheet having a thermal emissivity of 0.8 or more and a thickness of from 50 to 1,000 μm, the ceramic sheet being disposed adjacent to the graphite sheet.

According to an exemplary embodiment of the invention, such an organic electroluminescent device can be provided that has a novel structure and is capable of emitting light with high luminance for a long period of time by suppressing the device from being deteriorated due to heat generation.

DETAILED DESCRIPTION OF THE INVENTION

Figure 1:
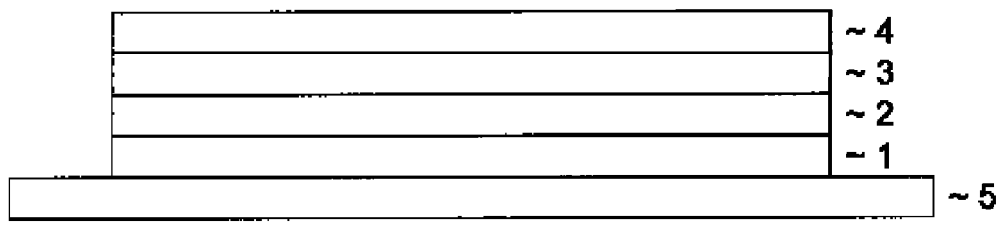
FIG. 1 is a schematic cross sectional view showing one embodiment of an organic electroluminescent device of the invention.

Exemplary embodiments of an organic electroluminescent device of the invention will be described in detail below.
(Organic Electroluminescent Device)

An organic electroluminescent device of the invention (hereinafter, sometimes referred to as "a device of the invention" or "an organic EL device") will be described. A device of the invention has a cathode and an anode on a substrate, and has an organic compound layer including an organic light-emitting layer (hereinafter, sometimes referred to as "a light-emitting layer") between the electrodes. It is preferred that at least one electrode of the anode and cathode is transparent in consideration of the nature of the light-emitting device.

A mode of accumulation of the organic compound layer in the invention is preferably such an embodiment that contains a hole transporting layer, a light-emitting layer and an electron transporting layer accumulated in this order from the side of the anode. A charge blocking layer or the like may be provided between the hole transporting layer and the light-emitting layer, or between the light-emitting layer and the electron transporting layer. A hole injecting layer may be provided between the anode and the hole transporting layer, and an electron injecting layer may be provided between the cathode and the electron transporting layer. The light-emitting layer may have a single layer structure or may be divided into the first light-emitting layer, the second light-emitting layer, the third light-emitting layer and the like. The layers each may be divided into plural secondary layers.
(Organic Light-Emitting Layer)

The organic light-emitting layer is a layer having such a function that upon application of an electric filed, holes are received from the anode, the hole injecting layer or the hole transporting layer, and electrons are received from the cathode, the electron injecting layer or the electron transporting layer, to provide a field for recombination of holes and electrons for luminescence.

The light-emitting layer in the invention may be formed solely of a light-emitting material or may be a mixed layer of a host material and a light-emitting material. The light-emitting material may be either a fluorescence light-emitting material or a phosphorescence light-emitting material, and the dopant may be one kind or plural kinds. The host material is preferably a charge transporting material. The host material may be one kind or plural kinds, and examples thereof include a mixture of an electron transporting host material and a hole transporting host material. The light-emitting layer may contain such a material that has no charge transporting property and does not provide luminescence.

The light-emitting layer may contain one layer or plural layers, and the plural layers may have different luminescent colors.

In the invention, two kinds or three or more kinds of light-emitting materials may be used to obtain a light-emitting device of an arbitrary color. In particular, a white light-emitting device having a high luminescent efficiency and a high luminance can be obtained by appropriately selecting light-emitting materials. For example, white luminescence can be obtained by using light-emitting materials emitting in colors that are in complementary color relationship, such as blue luminescence and yellow luminescence, cyan luminescence and magenta luminescence, and green luminescence and violet luminescence. White luminescence can also be obtained by combining light-emitting materials executing blue luminescence, green luminescence and red luminescence.

The host material may also have a function of a light-emitting material to emit light. For example, a device emitting light in white color may be obtained by luminescence of the host material and luminescence of the light-emitting material.

In the invention, two or more kinds of light-emitting materials different from each other may be simultaneously contained in one light-emitting layer, or in alternative, the light-emitting layer may have a multilayer structure obtained by accumulating layers containing the light-emitting materials, respectively, such as a blue light-emitting layer, a green light-emitting layer and a red light-emitting layer, and a blue light-emitting layer and a yellow light-emitting layer.

The luminescent color of the light-emitting layer may also be controlled by the following methods. These methods may be employed solely or in combination of them for controlling the luminescent color.

(Method for Controlling Luminescent Color by Providing Color Filter on Luminescent Side of Light-Emitting Layer)

A color filter controls the luminescent color by restricting the transmission wavelength. The color filter can be formed on a transparent substrate by using known materials, such as cobalt oxide as a blue filter, a mixed system of cobalt oxide and chromium oxide as a green filter, and iron oxide as a red filter, using a known thin film forming method, such as a vacuum deposition method.

(Method for Controlling Luminescent Color by Adding Material Accelerating or Inhibiting Luminescence)

For example, a so-called assist dopant, which receives energy from the host material and delivers the energy to the light-emitting material, may be added to facilitate energy transfer from the host material to the light-emitting material. The assist dopant may be selected from known materials and, for example, can be selected from those materials that can be used as the light-emitting material or the host material described later.

(Method for Controlling Luminescent Color by Adding Material Converting Wavelength to Layer on Luminescent Side of Light-Emitting Layer (Including Transparent Substrate)

A known wavelength converting material can be used for the material for this method, and for example, such a fluorescence converting substance can be used that converts light emitted from the light-emitting layer to light having another low energy wavelength. The kind of the fluorescence converting substance is appropriately selected corresponding to the wavelength of light to be emitted from the organic EL device and the wavelength of light emitted from the light-emitting layer. The using amount of the fluorescence converting substance can be appropriately determined depending on the kind thereof within such a range that concentration quenching does not occur. The fluorescence converting substance may be used as a sole kind thereof or as a mixture of plural kinds thereof. In the case where plural kinds thereof are used in combination, light of white color or additive color can be emitted in addition to blue light, green light and red light.

The fluorescence material used in the invention is not particularly limited, and can be appropriately selected from known materials. Examples thereof include those disclosed in JP-A-2004-146067, paragraph (0027), and JP-A-2004-103577, paragraph (0057), but the invention is not limited to them.

The phosphorescence material used in the invention is not particularly limited, and can be appropriately selected from known materials. Examples thereof include those disclosed in JP-A-2004-221068, paragraphs (0051) to (0057), but the invention is not limited to them.

As the substrate, the electrode, the organic layers, the other layers and the other constitutional components of the organic electroluminescent device of the invention, those components can be used that are disclosed in JP-A-2004-221068, paragraphs (0013) to (0082), JP-A-2004-214178, paragraphs (0017) to (0091), JP-A-2004-146067, paragraphs (0024) to (0035), JP-A-2004-103577, paragraphs (0017) to (0068), JP-A-2003-323987 (Idemitsu Kosan Co., Ltd.), paragraphs (0014) to (0062), JP-A-2002-305083 (Mitsubishi Chemical Corp.), paragraphs (0015) to (0077), JP-A-2001-172284, paragraphs (0008) to (0028), JP-A-2000-186094 (Idemitsu Kosan Co., Ltd.), paragraphs (0013) to (0075), and JP-A-2003-5897 Princeton University), paragraphs (0016) to (0118), but the invention is not limited thereto.

An organic electroluminescent device of the invention can emit light by applying a direct current voltage (which may contain an alternating current component depending on necessity) or a direct current between the anode and the cathode.

As the driving method of the organic electroluminescent device of the invention, those driving methods can be used that are disclosed in JP-A-2-148687, JP-A-6-301355, JP-A-5-29080, JP-A-7-134558, JP-A-8-234685, JP-A-8-241047, Japanese Patent No. 2,784,615, and U.S. Pat. No. 5,828,429 and No. 6,023,308.

An organic EL device of the invention exerts particularly significant heat radiation effect in the case where it executes luminescence with high luminance associated with particularly strong heat generation, preferably with a luminance of 1,000 cd/m$^2$ or more, and more preferably 3,000 cd/m$^2$ or more.

An organic EL device of the invention will be described in detail below with reference to an embodiment thereof shown in FIG. 1.

(Example of Combination of Heat Radiation Plates)

As shown in FIG. 1, an organic EL device according to an embodiment of the invention has a transparent substrate 5 having thereon a transparent electrode 1 as an anode, an organic layer (light-emitting layer) 2 containing an organic light-emitting material formed on the transparent electrode 1, a back electrode 3 as a cathode formed on the organic layer 2, and a heat radiation plate 4 adhered on the side of the back electrode 3 opposite to the organic layer 2 adjacent thereto, and upon applying an electric current between the transparent electrode 1 and the counter electrode 3, the organic layer 2 generates light, which is taken out from a luminescent surface of the transparent substrate 5 on the transparent electrode 1 side.

Figure 2:
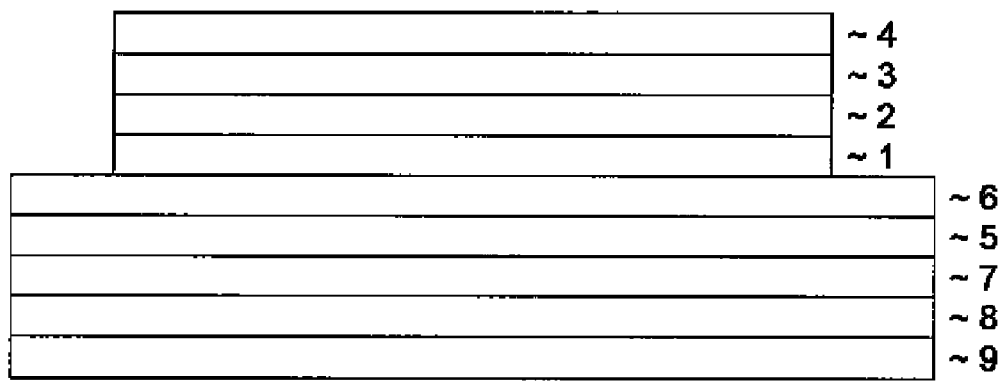
FIG. 2 is a schematic cross sectional view showing another embodiment of an organic electroluminescent device of the invention.

Another organic EL device of the invention is described in detail below with reference to an embodiment thereof shown in FIG. 2. As shown in FIG. 2, an organic EL device according to an embodiment of the invention has a film 5 having thereon an indium z inc oxide layer 6 which in turn has thereon a transparent electrode 1 as an anode, an organic layer (light-emitting layer) 2 containing an organic light-emitting material formed on the transparent electrode 1, a back electrode 3 as a cathode formed on the organic layer 2, and a heat radiation plate 4 adhered on the side of the back electrode 3 opposite to the organic layer 2 adjacent thereto. The FIG. 2 embodiment additionally has a $SiO_x$ (inorganic gas barrier layer)+organic layer 7, a hygroscopic layer 8, and an organic layer+$SiO_x$ (inorganic gas barrier layer) 9. Together, layers 7-9 constitute a moisture barrier film.

(Ceramic Sheet)

A ceramic sheet used in the invention will be described in detail.

A ceramic sheet of the invention may contain a substrate having thereon a coated film containing at least one of sodium silicate and potassium silicate.

Examples of the substrate include a flexible polymer, such as polyethylene terephthalate, polyethylene naphthalate, polyether sulfone, polystyrene, polyethylene, polyarylate, polyether polyketone, polycarbonate, polypropylene, polyimide and triacetyl cellulose, and a double sided adhesive tape, such as Acryl Soft Tape 9894 FR-10, produced by Sumitomo 3M Ltd.

The thickness of the ceramic sheet is generally from 50 to 1,000 μm, preferably from 80 to 800 μm, and more preferably from 100 to 500 μm. In the case where the thickness of the sheet is less than 50 μm, the thermal emissivity is lowered, and the sheet becomes brittle to deteriorate the flexural strength. In the case where the thickness exceeds 1,000 μm, on the other hand, the heat is difficult to be radiated due to the large heat capacity thereof, and the sheet is difficult to be bent, which cannot be a flexible material. The thermal emissivity (according to JIS A1423) of the ceramic sheet of the invention is generally 0.8 or more, preferably 0.85 or more, and more preferably from 0.9 to 0.99. The thermal emissivity is preferably as high as possible from the standpoint of heat radiation property. The heat radiation herein means radiation of heat through conversion of heat energy to electromagnetic wave, and the thermal emissivity is a value showing an intensity of an infrared ray emitted from a material having heat in terms of a percentage with respect to the ideal blackbody as 1.0 (or 100%).

The ceramic sheet of the invention may have a substrate having thereon a coated film containing at least one of sodium silicate and potassium silicate. In particular, sodium silicate and potassium silicate are used as a mixture. The coated film may further contain an alkali silicate other than sodium and potassium, such as lithium silicate. The coated film may further contain a metallic oxide. Preferred examples of the metallic oxide include silicon oxide and aluminum oxide. The coated film may further contain tin oxide. Tin oxide may be added to at least one of the systems of sodium silicate and potassium silicate, or the metallic oxide is added to at least one of the systems of sodium silicate and potassium silicate, and tin oxide may further be added thereto. Examples of the metallic oxide that may be added to the coated film in the invention include, in addition to aluminum silicate (kaolin), magnesium silicate (talc), silicon oxide, aluminum oxide and tin oxide, titanium oxide, zirconium oxide, antimony oxide, germanium oxide, boron oxide, calcium oxide, barium oxide, strontium oxide and bismuth oxide.

Natural minerals, such as kaolin or talc, containing the metallic compounds may be contained. A metallic nitride may also be contained. Examples of the metallic nitride include boron nitride, zirconium nitride, tin nitride, strontium nitride, titanium nitride and barium nitride. The metallic oxide, the metallic nitride and the like contained in the coated film of the invention are preferably used in the form of fine powder. The materials may be formed into fine powder by pulverizing with a ball mill, a jet mill or the like.

In the case where sodium silicate and potassium silicate are used as a mixture, the ratio of sodium silicate and potassium silicate by weight is preferably from 0.5 to 7 of sodium silicate (solid basis) per 1 of potassium silicate. The content of the alkali silicate in the coated film is preferably from 3 to 30% by weight. The proportion of the metallic oxide is preferably from 12 to 92% by weight based on the solid content in the coated film. The proportion of tin oxide is preferably from 6 to 45% by weight based on the solid content in the coated film.

A coating composition for forming the coated film contains at least one of sodium silicate and potassium silicate as base materials. Sodium silicate and potassium silicate are available in the form of an aqueous solution. An aqueous solution of sodium silicate is known as liquid glass. The aqueous solutions of sodium silicate and potassium silicate may be used after diluting with water. An aqueous solution containing at least one of sodium silicate and potassium silicate as a coating composition is coated on the substrate by such a method as spray coating, brush coating or screen printing. After coating, the coated film is dried in the air. The coated film is formed on the surface of the substrate as a result of drying. The resulting ceramic sheet exhibits excellent heat radiation property.

The coating composition for forming the coated film may further contain fine particles of silicon oxide or aluminum oxide. In this case, the coating composition is in the form of a suspension liquid. The heat radiation material obtained by coating the suspension liquid on the substrate in the similar manner exhibits significant heat radiation effect. Furthermore, fine powder of tin oxide may be added thereto. The coating composition containing tin oxide exhibits further excellent heat radiation property. The coating composition necessarily has an appropriate viscosity, and it is preferred to adjust the viscosity of the composition by adding water corresponding to the kinds and amounts of the additives.

In the invention, a ceramic sheet is provided on the side of the back electrode opposite to the side having the light-emitting layer. An device of the invention may not have a moisture proof film from the standpoint of heat radiation property, but in the case where the whole area of a luminescent part or the whole area of the luminescent part and an electric feeder part is coated with a moisture proof film, the ceramic sheet may be provided on the back electrode with the moisture proof film intervening between them. It is preferred that the ceramic sheet is provided directly on the back electrode from the standpoint of heat radiation property.

The area of the ceramic sheet is not particularly limited and is preferably as large as possible within the limitation in device design from the standpoint of heat radiation property, but it is preferably not too large from the standpoint of light weight property, flexibility and freedom in installation location. The area of the ceramic sheet is preferably from 0.7 to 2 times, and more preferably from 0.9 to 1.5 times, the luminescent area of the EL device.

The method for mounting the ceramic sheet to the EL device is not particularly limited, and examples thereof include mounting with an adhesive, embedding in the EL device moisture proof film, and filling to the substrate with a resin.

The ceramic sheet may preferably have a mechanism for cooling the same for the purpose of improving the heat radiation property. Specific examples thereof include a method of providing cooling fins on the ceramic sheet, and a method of providing an electronic cooling device, such as peltiert device, thereon.

(Graphite Sheet)

A graphite sheet used in the invention will be described in detail. A graphite sheet used herein is a sheet containing graphite as a substantial major component, and the content of carbon atoms in the graphite sheet is preferably 98.0% by mass or more, more preferably 99.0% by mass or more, and further preferably 99.5% by mass or more.

The graphite sheet used in the invention is preferably a highly oriented graphite sheet excellent in electroconductivity and thermal conductivity. The production process of the highly oriented graphite sheet will be described below, but the invention is not limited thereto.

The highly oriented graphite sheet can be obtained by processing a stretched aromatic imide film in an inert gas atmosphere at 2,600° C. It is considered that the film is stretched to orient the aromatic units in parallel to the film surface, so as to facilitate production of oriented graphite. As another production process, the highly oriented graphite sheet can be obtained by subjecting a mixture of carbon powder and a phenol resin to pressurized curing under heat into a prescribed shape. The carbon powder herein may be any material containing carbon as a major component, such as carbon black, graphite and charcoal powder. The shape of the carbon powder is not particularly limited, and spherical carbon powder is preferred since it is easily dispersed uniformly in a phenol resin to provide high reliability upon forming the device. Examples of the phenol resin include a novolac type and a resole type, both of which may be used in the invention.

The electroconductivity of the graphite sheet is preferably as high as possible, and is preferably 1,000 S/cm or more, and more preferably 5,000 S/cm or more.

The graphite sheet preferably has a high thermal conductivity from the standpoint of suppressing temperature increase due to heat generation in the organic EL device, and specifically, the thermal conductivity thereof is preferably from 200 to 1,000 W/m·K, more preferably from 300 to 1,000 W/m·K, and further preferably from 400 to 1,000 W/m·K.

The thickness of the graphite sheet is preferably from 50 μm to 5 mm, more preferably 80 μm to 3 mm, and further preferably from 100 μm to 1 mm.

(Effect of Combination of Ceramic Sheet and Graphite Sheet)

The heat generation of the organic electroluminescent device of the invention is influenced by the resistance of the transparent electrode owing to the luminescence mechanism by electric current driving, and the heat generation distribution largely varies between the contact part of the transparent electrode and an electric wiring and the part of the transparent electrode most remote from the contact part. The graphite sheet in the invention has a function of uniformizing the heat generation distribution owing to the excellent thermal conductivity thereof. The ceramic sheet excellent in heat radiation property is combined to the state where the heat generation distribution is uniformized with the graphite sheet, whereby heat radiation is realized with good efficiency, which is one of the characteristic features of the invention.

The device of the invention may have a moisture barrier layer for avoiding influence of moisture and oxygen from the external environment. The moisture barrier layer may be coated as a film directly on the device by CVD, or the device may be coated with a moisture barrier film having the moisture barrier layer. The device may be held with glass or metallic plates, the edges of which are coated with a moisture proof resin. The moisture barrier film used in the invention will be described below.

(Moisture Barrier Film)

A moisture barrier film used in the invention has a substrate film having thereon at least two inorganic gas barrier layers, and at least one hygroscopic layer formed of an oxide of an alkaline earth metal between the two inorganic gas barrier layers. The moisture barrier film used in the invention has an accumulated structure and attains both high gas barrier capability and high hygroscopic capability by using the hygroscopic layer formed of an alkaline earth metal monoxide between the at least two inorganic gas barrier layers.

The moisture barrier film used in the invention has a substrate film having thereon at least two inorganic gas barrier layer and at least one hygroscopic layer, and may further have an organic layer, an antistatic layer and the like depending on necessity.

(Inorganic Gas Barrier Layer)

The inorganic gas barrier layer in the invention means such a thin layer constituted by an inorganic material that has a dense structure capable of suppressing gas molecules from being transmitted. Examples thereof include a thin film formed of a metallic compound (metallic compound thin film). The method for forming the inorganic gas barrier layer is not limited as far as the target thin film can be obtained thereby. Preferred examples of the forming method of the inorganic gas barrier layer include the sputtering method, the vacuum deposition method, the ion plating method and the plasma CVD method, and specifically, those methods can be employed that are disclosed in Japanese Patent No. 3,400, 324, JP-A-2002-322561 and JP-A-2002-361774.

The components contained in the inorganic gas barrier layer are not limited as far as they satisfy the aforementioned capabilities, and examples thereof include an oxide, a nitride and an oxynitride containing at least one metal selected from Si, Al, In, Sn, Zn, Ti, Cu, Ce and Ta.

The thickness of the inorganic gas barrier layer is not particularly limited, but a too large thickness brings about a possibility of cracks formed, and a too small thickness may cause the layer in an island form, both of which tend to deteriorate the moisture barrier property. Therefore, the thickness of each of the gas barrier layers is preferably in a range of from 5 to 1,000 nm, more preferably from 10 to 1,000 nm, and most preferably from 10 to 200 nm.

The at least two inorganic gas barrier layers may have the same composition or different composition with no limitation.

It is preferred in the invention to use silicon oxide, silicon nitride or a silicon oxynitride as the inorganic gas barrier layer for attaining both moisture barrier property and high transparency. In the case where $SiO_x$, which is silicon oxide, is used as the inorganic gas barrier layer, the value x preferably satisfies $1.6<x<1.9$ for attaining both good moisture barrier property and high light transparency. In the case where $SiN_y$, which is silicon nitride, is used as the inorganic gas barrier layer, the value y preferably satisfies $1.2<y<1.3$. In the case where the value y is in the range, substantially no coloration occurs, and the layer can be favorably used in a display device.

In the case where $SiO_xN_y$, which is silicon oxynitride, is used as the inorganic gas barrier layer, an oxygen-rich film is preferably used when placing importance on improvement in adhesiveness, and specifically the values x and y preferably satisfy $1<x<2$ and $0<y<1$. A nitrogen-rich film is preferably used when placing importance on improvement in moisture barrier property, and specifically the values x and y preferably satisfy $0<x<0.8$ and $0.8<y<1.3$.

(Hygroscopic Layer)

The hygroscopic layer in the invention means a layer constituted by an alkaline earth metal monoxide, and examples of the alkaline earth metal contained in the alkaline earth metal monoxide include Be, Mg, Ca, Sr, Ba and Ra. Any of the alkaline earth metals may be used in the invention, and Mg, Ca, Sr and Ba are preferably used from the standpoint of cost, availability of a high purity material, and practicality.

The alkaline earth metal monoxide is an oxide containing one atom of an alkaline earth metal bonded to about one oxygen atom. The composition of the hygroscopic layer can be expressed by $MO_z$, wherein M represents an alkaline earth metal, and the value z preferably satisfies $0.8<z<1.2$, and more most preferably satisfies $0.9<z<1.1$.

The alkaline earth metal monoxide has such features that attains both sufficiently high hygroscopic property and transparency, and suffers a relatively small volume change before and after absorbing moisture. Furthermore, the alkaline earth metal monoxide is hard to cause intra-layer diffusion as compared to an alkali metal, and thus is suitable for application to a device material from which diffusion of an ionic metal should be avoided. Moreover, the alkaline earth metal monoxide incorporates water molecules within the molecules thereof, which is different from physical adsorption in silica gel and zeolite, and thus is suitable for the purpose of the invention since adsorbed water molecules are not redesorbed.

The hygroscopic layer can be formed by coating a dispersion of an alkaline earth metal monoxide and then sintered at a high temperature of 400° C. or more, but in this manner, there are some cases where the substrate film is restricted on heat resistance, and the highly hygroscopic material is difficult to handle in an inert atmosphere. Therefore, the hygroscopic layer is preferably formed by the vacuum film forming method described later from the standpoint of obtaining stable performance. Examples of the vacuum film forming method include a method of vacuum-depositing a source of the alkaline earth metal monoxide, a method of vacuum-depositing an alkaline earth metal or a partial oxide thereof in an oxidative atmosphere, and a method of vacuum-depositing an alkaline earth metal peroxide. In the vacuum deposition method, an ion plating method combined with ion assistance may be employed. The vacuum deposition method is most preferably such a sputtering method that uses an alkaline earth metal peroxide, which is easily handled as a source and has good quality, as a target as disclosed in JP-A-2000-26562.

It is technically possible that a hygroscopic layer containing both an alkaline earth metal monoxide and an inorganic compound, such as $SiO_x$, $SiN_y$, $SiO_xN_y$ and SiC, by the co-deposition method or the co-sputtering method, and a hygroscopic layer containing both an alkaline earth metal monoxide and acetic anhydride or diacetic acid by the coating method. However, the hygroscopic layer formed solely with an alkaline earth metal monoxide according to the invention is excellent in uniformity, transparency and oxygen barrier property in comparison to the aforementioned complex layers. It is an unexpected result that the hygroscopic layer of the invention has the characteristics because it is unlikely that physical or chemical changes occur with an inert concomitant.

The thickness of the hygroscopic layer is preferably from 10 to 200 nm, more preferably from 10 to 100 nm, and particularly preferably from 10 to 50 nm, from the standpoint of hygroscopicity, smoothness, transmissibility and anti-flexural property. In the case where the hygroscopic layer has a thickness in the aforementioned range, the alkaline earth metal monoxide can be easily formed into a continuous layer to provide hygroscopic capability for attaining sufficient effect, and no defect may occur to avoid delamination breakage, whitening and optical interference patterns.

The hygroscopic layer is preferably a uniform layer, and particularly a uniform layer having a thickness of from 10 to 200 nm. The uniform layer referred herein means a layer having a uniform composition over the layer. The uniform layer is hard to suffer a mechanical or optical discontinuous boundary to provide such an advantage that the layer is suitable for a display material.

(Organic Layer)

The moisture barrier film used in the invention may have organic layers adjacent to the inorganic gas barrier layer and the hygroscopic layer for improving the brittleness and the barrier property thereof. The organic layer is preferably formed by coating or vapor-depositing an ultraviolet ray or electron beam curable monomer, oligomer or resin to form a film, and curing the film with an ultraviolet ray or an electron beam.

The organic layer that is formed with a polymer obtained by crosslinking a monomer as a major component will be described as an example. The monomer is not particularly limited as far as it can be crosslinked by irradiation with an ultraviolet ray or an electron beam, and a monomer having an acryloyl group, a methacryloyl group or an oxetane group is preferred.

The organic layer is preferably contains, as a major component, a polymer obtained by crosslinking a bifunctional or higher functional monomer having an acryloyl group or a methacryloyl group selected from epoxy (meth)acrylate, urethane (meth)acrylate, isocyanuric acid (meth)acrylate, pentaerythritol (meth)acrylate, trimethylolpropane (meth)acrylate, ethylene glycol (meth)acrylate and polyester (meth)acrylate. The bifunctional or higher functional monomer having an acryloyl group or a methacryloyl group may be used as a mixture of two or more kinds thereof or may be used after mixing with a monofunctional (meth)acrylate.

Examples of the monomer having an oxetane group include monomers having the structures disclosed in the formulae (3) to (6) in JP-A-2002-356607, which may be used after arbitrarily mixing them.

The organic layer more preferably contains, as a major component, isocyanuric acid acrylate, epoxy acrylate or urethane acrylate having a high crosslinking degree and a glass transition temperature of 200° C. or more from the standpoint of heat resistance and solvent resistance that are demanded in display purpose. The thickness of the organic layer is not particularly limited, but in the case where the thickness of the organic layer is too small, uniformity in thickness is difficult to obtain, and structural defects of the inorganic gas barrier layer cannot be efficiently filled to fail to improve the barrier property. In the case where the thickness of the organic layer is too large, cracks are liable to occur in the organic layer due to an external force, such as a bending force, to cause such a problem that the barrier property is deteriorated. Under the circumstances, the thickness of the organic layer is preferably from 10 to 5,000 nm, more preferably from 10 to 2,000 nm, and most preferably from 10 to 5,000 nm.

Examples of the method for forming the organic layer include a method of forming a coated film containing a crosslinkable monomer and curing the coated film by irradiating with an electron beam or an ultraviolet ray. Examples of the method for forming the coated film include a coating method and a vacuum film forming method. The vacuum film forming method is not particularly limited, and such a film forming method as vapor deposition or plasma CVD is preferred, and a resistance heated vapor deposition method is more preferred since the film forming rate of the organic monomer can be easily controlled. The method for crosslinking the crosslinkable monomer is not particularly limited, and crosslinking with an electron beam or an ultraviolet ray is preferred since the apparatus therefor can be easily mounted in a vacuum chamber, and polymerization through crosslinking reaction rapidly proceeds.

In the case where the coated film is formed by the coating method, various coating method having been conventionally employed can be used, such as spray coating, spin coating and bar coating.

The coated film may be formed by either the coating method and the vapor deposition method, and the vacuum vapor deposition method is preferably used since the method suppresses the inorganic gas barrier layer immediately under the organic layer from suffering mechanical stress after forming the film, and the method is advantageous for forming a thin film.

(Other Functional Layers and Constitutions of Layers)

The moisture barrier film used in the invention may have a primer layer or an inorganic thin film layer having been conventionally known between the substrate film and the inorganic gas barrier layer. Examples of the primer layer include a resin layer, such as an acrylic resin, an epoxy resin, a urethane resin and a silicone resin, an organic-inorganic hybrid layer formed through sol-gel reaction in the presence of a hydrophilic resin, an inorganic vapor deposition layer and a dense inorganic layer obtained by the sol-gel method. The inorganic vapor deposition layer is preferably a deposition layer of silica, zirconia or alumina. The inorganic vapor deposition layer can be formed by the vacuum deposition method and the sputtering method.

In the invention, the hygroscopic layer is provided between the two inorganic gas barrier layers on the substrate film, and the position thereof may be either a position adjacent to the two inorganic gas barrier layers, a position adjacent to the inorganic gas barrier layer and the organic layer, or a position adjacent to the two organic layers. The hygroscopic layer is preferably disposed between the two inorganic gas barrier layers in such a manner that it is adjacent to the two organic layers from the standpoint that the influence of deformation due to brittleness and volume change of the hygroscopic layer before and after adsorption of moisture.

One or more or each of an inorganic gas barrier layer, a hygroscopic layer and an organic layer may be provided in an arbitrary order on the side of the hygroscopic layer opposite to the substrate film, i.e., on the outer side of the hygroscopic layer where the side of the hygroscopic layer having the substrate film provided is assumed to be the inner side. Various kinds of functional layers may be provided on the outer side of the inorganic gas barrier layer provided on the outer side of the hygroscopic layer or may be provided as the outermost layer. Examples of the functional layer include an optically functional layer, such as an antireflection layer, a polarizing layer, a color filter, an ultraviolet ray absorbing layer and a light emission efficiency improving layer, a mechanically functional layer, such as a hardcoat layer and a stress relieving layer, an electrically functional layer, such as an antistatic layer and an electroconductive layer, an antifogging layer, an antifouling layer, and a printing layer. These functional layers may be provided on the side of the substrate film opposite to the inorganic gas barrier layer, the hygroscopic layer and the organic layer.

The moisture barrier film used in the invention may have the inorganic gas barrier layers, the hygroscopic layers and the organic layers on both surfaces of the substrate film.

Furthermore, a gas barrier laminated layer having at least an inorganic gas barrier layer, an organic layer and an inorganic gas barrier layer accumulated in this order may be provided on the side of the hygroscopic layer opposite to the substrate film. The gas barrier laminated layer prevents water molecules from penetrating from the opposite surface of the film to suppress dimensional change of the film substrate, whereby the gas barrier layer is prevented from suffering stress concentration and breakage, and as a result, a display having high durability can be provided.

(Substrate Film)

The substrate film used in the moisture barrier film used in the invention is not particularly limited as far as it is a film capable of retaining the aforementioned layers, and can be appropriately selected depending on purposes. Specific examples of the substrate film include thermoplastic resins, such as a polyester resin, a methacrylate resin, a methacrylic acid-maleic acid copolymer, a polystyrene resin, a transparent fluorine resin, a polyimide resin, a fluorinated polyimide resin, a polyamide resin, a polyamideimide resin, a polyetherimide resin, a cellulose acylate resin, a polyurethane resin, a polyether ether ketone resin, a polycarbonate resin, an alicyclic polyolefin resin, a polyarylate resin, a polyether sulfone resin, a polysulfone resin, a cycloolefin copolymer, a fluorene ring-modified carbonate resin, an alicyclic ring-modified carbonate resin, and an acryloyl compound. Among these resins, preferred examples thereof include a polyester resin, and particularly a polyethylene naphthalate (PEN) resin, a polyarylate (PAr) resin, a polyether sulfone (PES) resin, a fluorene ring-modified carbonate (BCF-PC) resin (the compound in Example 4 of JP-A-2000-227603), an alicyclic ring-modified carbonate (IP-PC) resin (the compound in Example 5 of JP-A-2000-227603), and an acryloyl compound (the compound in Example 1 of JP-A-2002-80616).

As the compound constituting the substrate film, a resin having a spiro structure represented by the following formula (1) and a resin having a cardo structure represented by the following formula (2) are preferred:

Formula (1):

wherein the ring α each represents a monocyclic or polycyclic ring, and two rings are bonded through a spiro structure:

Formula (2):

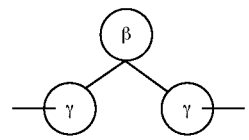

wherein the ring β and the ring γ each represents a monocyclic or polycyclic ring, provided that two rings γ may be the same or different, and the ring β and the ring γ are bonded through one quaternary carbon atom on the ring β.

The resins represented by the formulae (1) and (2) are have a high heat resistance, a high elastic modulus and a high tensile breaking stress and are suitable for a substrate material of an organic EL device, which is required to withstand various heating operations during the production process and to withstand flexural breakage.

Examples of the ring α in the formula (1) include indane, chroman and banzofuran. Preferred examples of the resin having a spiro structure represented by the formula (1) include a polymer having a spirobiindane structure represented by the following formula (3) in repeating units, a polymer having a spirobichroman structure represented by the following formula (4) in repeating units, and a polymer having a spirobibenzofuran structure represented by the following formula (5) in repeating units:

Formula (3):

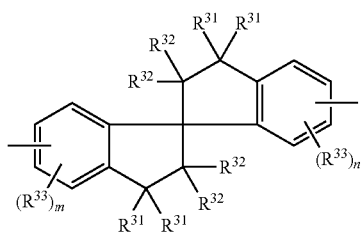

wherein $R^{31}$, $R^{32}$ and $R^{33}$ each independently represents a hydrogen atom or a substituent, provided that $R^{31}$, $R^{32}$ and $R^{33}$ each may be connected to form a ring, and m and n each independently represents an integer of from 1 to 3. Preferred examples of the substituent include a halogen atom, an alkyl group and an aryl group. $R^{31}$ and $R^{32}$ each independently preferably represents a hydrogen atom, a methyl group or a phenyl group. $R^{33}$ preferably represents a hydrogen atom, a chlorine atom, a bromine atom, a methyl group, an isopropyl group, a tert-butyl group or a phenyl group:

Formula (4):

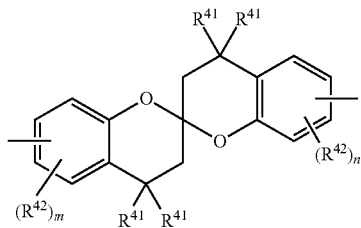

wherein $R^{41}$ and $R^{42}$ each independently represents a hydrogen atom or a substituent, provided that $R^{41}$ and $R^{42}$ each may be connected to form a ring, and m and n each independently represents an integer of from 1 to 3. Preferred examples of the substituent include a halogen atom, an alkyl group and an aryl group. $R^{41}$ preferably represents a hydrogen atom, a methyl group or a phenyl group, and $R^{42}$ preferably represents a hydrogen atom, a chlorine atom, a bromine atom, a methyl group, an isopropyl group, a tert-butyl group or a phenyl group:

Formula (5):

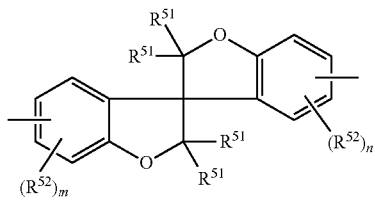

wherein $R^{51}$ and $R^{52}$ each independently represents a hydrogen atom or a substituent, provided that $R^{51}$ and $R^{52}$ each may be connected to form a ring, and m and n each independently represents an integer of from 1 to 3. Preferred examples of the substituent include a halogen atom, an alkyl group and an aryl group. $R^{51}$ preferably represents a hydrogen atom, a methyl group or a phenyl group, and $R^{52}$ preferably represents a hydrogen atom, a chlorine atom, a bromine atom, a methyl group, an isopropyl group, a tert-butyl group or a phenyl group.

In the formula (2), examples of the ring β include fluorene and 1,4-bibenzocyclohexane, and examples of the ring γ include phenylene and naphthalene. Preferred examples of the resin having a cardo structure represented by the formula (2) include a polymer having a fluorene structure represented by the following formula (6) in repeating units:

Formula (6):

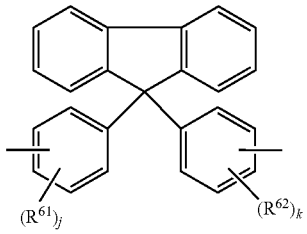

wherein $R^{61}$ and $R^{62}$ each independently represents a hydrogen atom or a substituent, provided that $R^{61}$ and $R^{62}$ each may be connected to form a ring, and j and k each independently represents an integer of from 1 to 4. Preferred examples of the substituent include a halogen atom, an alkyl group and an aryl group. $R^{61}$ and $R^{62}$ each independently preferably represents a hydrogen atom, a chlorine atom, a bromine atom, a methyl group, an isopropyl group, a tert-butyl group or a phenyl group.

The resins containing the repeating units represented by the formulae (3) to (6) may be polymers having various kinds of bonding systems, such as polycarbonate, polyester, polyamide, polyimide and polyurethane, and are preferably polycarbonate, polyester or polyurethane derived from bisphenol compounds having the structures represented by the formulae (3) to (6).

Specific examples of the resin having a structure represented by the formula (1) or (2) are shown below as resin compounds (I-1) to (FL-11), but the invention is not limited thereto.

I-1 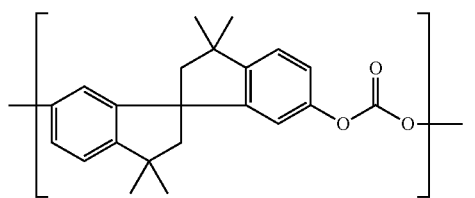
I-2 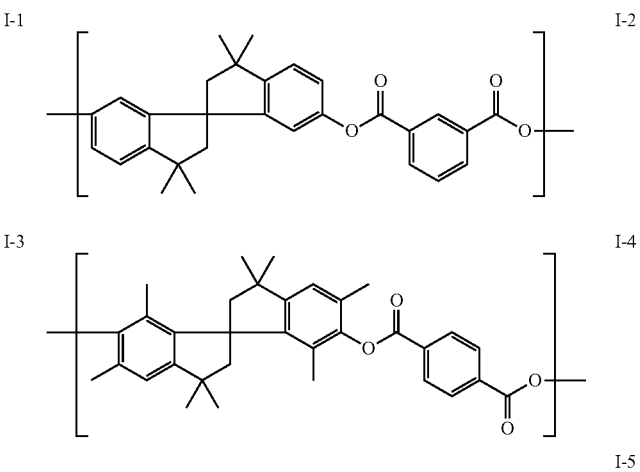
I-3 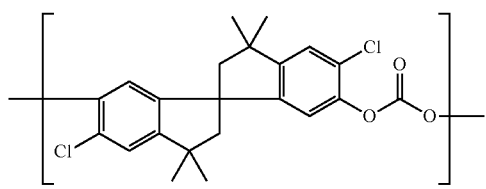
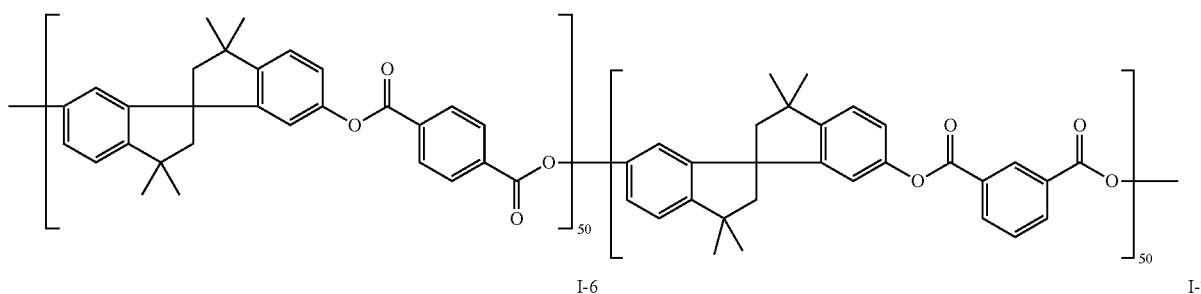
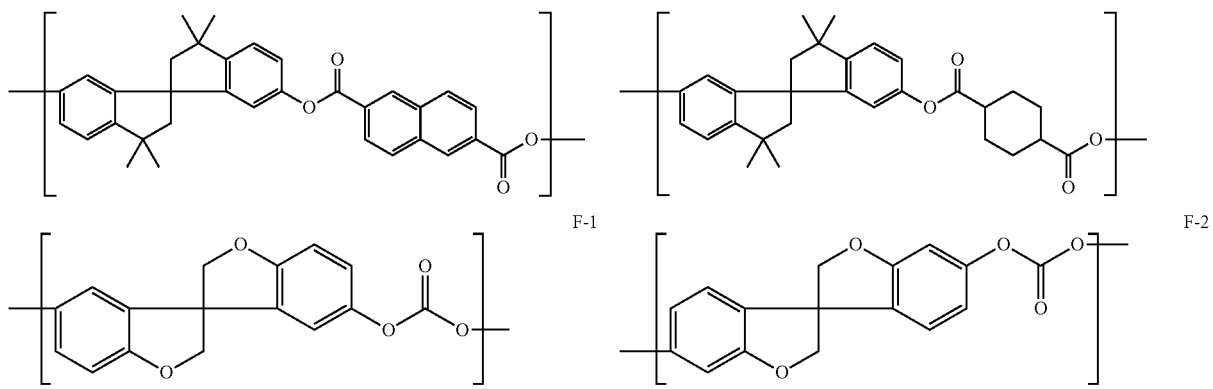
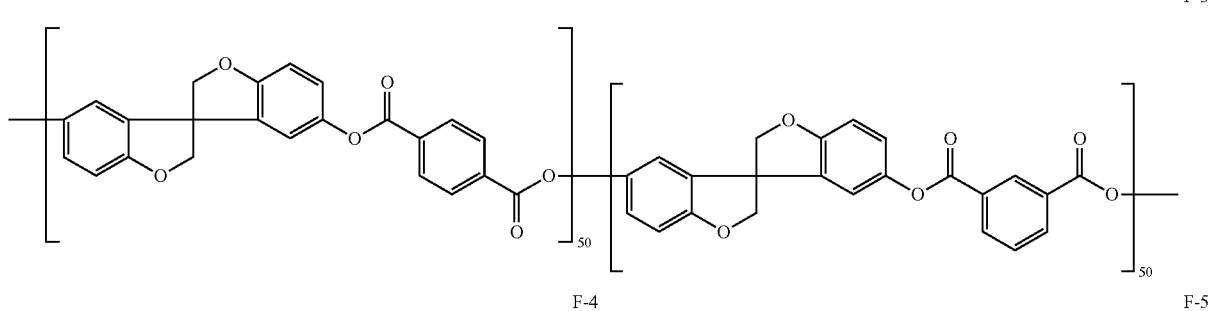
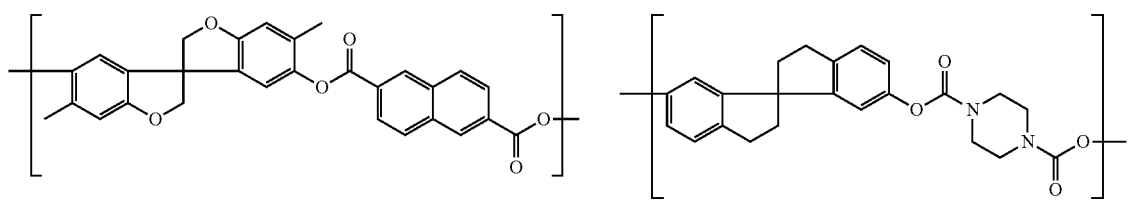

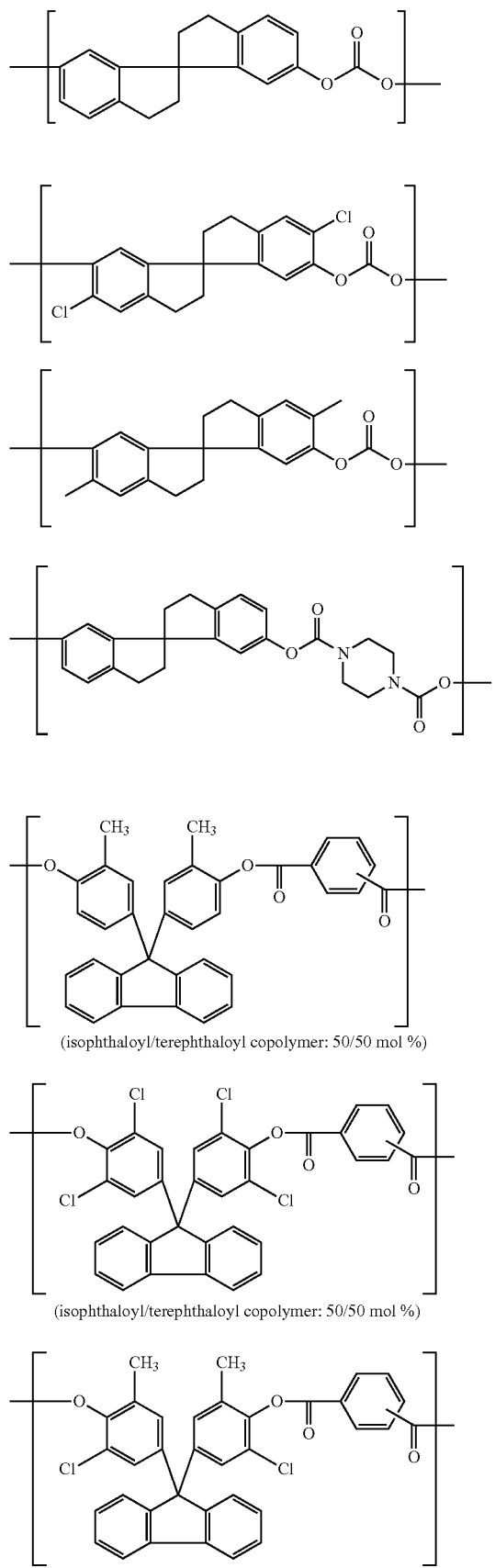

-continued

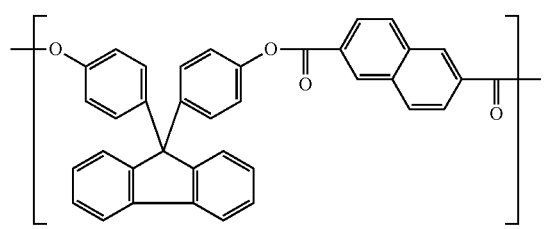

FL-7

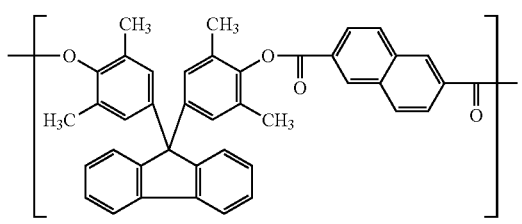

FL-8

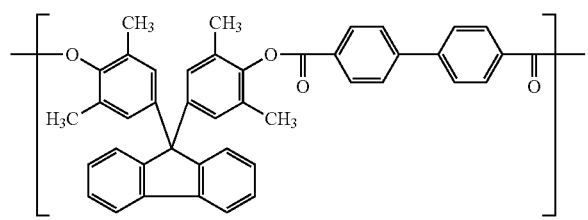

FL-9

Copolymer of FL-8 and FL-9 (80/20 mol %)

FL-10

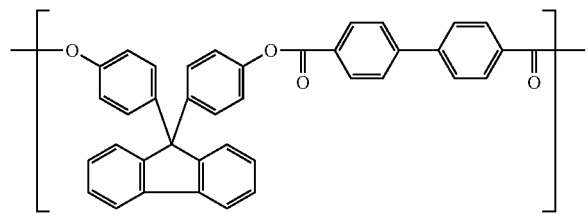

FL-11

Copolymer of FL-7 and FL-11 (80/20 mol %)

FL-12

The resin having a structure represented by the formula (1) or (2) that can be used as the substrate film in the invention may be used solely or as a mixture of plural kinds thereof. The resin may be a homopolymer or a copolymer having plural structures in combination. In the case where the resin is a copolymer, the resin may contain a known repeating unit that does not contain a structure represented by the formula (1) or (2) in such an amount that does not impair the effect of the invention. The resin is preferably a copolymer since a copolymer is often excellent in solubility and transparency in comparison to a homopolymer.

The preferred molecular weight of the resin having a structure represented by the formula (1) or (2) used in the invention is preferably from 10,000 to 500,000, more preferably from 20,000 to 300,000, and particularly preferably from 30,000 to 200,000, in terms of weight average molecular weight from the standpoint of easiness in film formation, mechanical characteristics, easiness in controlling the molecular weight upon synthesis, viscosity of the solution, and easiness in handling the solution. The molecular weight may be determined based on the viscosity corresponding thereto. The resin constituting the substrate film in the invention is preferably a thermoplastic resin having a glass transition temperature (Tg) of 250° C. or more, and more preferably a thermoplastic resin having a glass transition temperature (Tg) of 300° C. or more.

The substrate film in the invention preferably does not incorporate water as its nature, i.e., it is preferably formed with a resin having no hydrogen bond functional group. The equilibrium water content of the substrate film is preferably 0.5% by mass or less, more preferably 0.1% by mass or less, and particularly preferably 0.05% by mass or less.

In the case where a substrate film having a low equilibrium water content is used, there is such a tendency that the substrate film is liable to be charged. When the substrate film is charged, it is not preferred since the substrate film adsorbs particles to impair the performance of the barrier layer and causes adhesion to impair the handling property. In order to solve the problem, an antistatic layer is preferably formed on the surface of the substrate film. The antistatic layer herein is a layer having a surface resistance of from 1 to $10^{13}$ Ω per square at a temperature of 50° C. and a relative humidity of 30%. The surface resistance of the antistatic layer at a temperature of 50° C. and a relative humidity of 30% is preferably from $1\times10^8$ to $1\times10^{13}$ Ω per square, more preferably from $1\times10^8$ to $1\times10^{11}$ Ω per square, and particularly preferably $1\times10^8$ to $1\times10^9$ Ω per square.

(Transparent Electrode)

The transparent electrode used in the invention may be formed of an arbitrary material for a transparent electrode having been ordinarily used. Examples of the material for a transparent electrode include an electroconductive metal oxide, such as antimony-doped or fluorine-doped tin oxide (ATO or FTO), tin oxide, zinc oxide, indium oxide, tin-doped indium oxide (ITO) and indium zinc oxide (IZO), a multilayer structure having a silver thin film held with layers having a high refractive index, and a π conjugated polymer, such as polyaniline and polypyrrole. The transparent electrode can be produced by forming a transparent electroconductive film formed of the aforementioned material for a transparent electrode on a substrate formed of a transparent sheet, such as polyethylene terephthalate (PET) and polyethylene naphthalate (PEN).

The resistance of the electrode that is preferably used as the transparent electrode in the invention is preferably from 0.05 to 50 Ω per square, and more preferably from 0.1 to 30 Ω per square, in terms of surface resistivity from the standpoint of uniformity in luminance on the luminescent surface.

(Back Electrode)

The back electrode used in the invention may be an electrode, through which light from the light-emitting layer goes outside. Examples of he material for a back electrode include metal, alloy, metal oxide, electroconductive compound and the mixture thereof. Specifically, the examples include alkali metal (e.g., Li, Na, K, Cs), alkali earth metal (e.g., Mg, Ca), gold, silver, lead, aluminum, sodium-potassium alloy, lithium-aluminum alloy, magnesium-silver alloy, rare earth metal such as indium and ytterbium. The electroconductive film (back electrode) of the above back electrode material can be formed by the sputtering method, the vacuum deposition method or the ion plating method.

The thickness of the back electrode is preferably from 10 nm to 5 µm, more preferably 50 nm to 1 µm.

The back electrode may be transparent or translucent. The transparent back electrode can be formed by subjecting the back electrode material to film formation into a thin thickness of from 1 to 10 nm and further stacking a transparent electroconductive material such as ITO and IZO thereon.

Specific examples of the organic EL device of the invention will be described below, but the invention is not limited to the examples.

The invention will be described in more detail with reference to the following examples, but the invention is not limited thereto.

EXAMPLE 1

On a glass supporting substrate having a dimension of 25 mm×25 mm×0.5 mm, an anode of indium tin oxide (ITO, indium/tin=95/5 by mole) was formed by the sputtering method. On the anode, copper phthalocyanine (CuPc) was formed to a thickness 10 nm as a hole injecting layer by the vacuum deposition method, and N,N'-dinaphthyl-N,N'-diphenylbenzidine was formed thereon to a thickness of 40 nm as a hole transporting layer by the vacuum deposition method. On the hole transporting layer, 4,4'-N,N'-dicarbazolediphenyl as a host material, [(4,6-difluorophenyl)-prydinate-N,C2'] (picolinate) iridium complex (Firpic) as a blue light-emitting material, (2-phenylpyridine) iridium complex (Ir(ppy)3) as a green light-emitting material, and bis(2-phenylquinoline)acetylacetonate iridium as a red light-emitting material were co-deposited to a weight ratio of 100/2/4/2 to obtain a light-emitting layer having a thickness of 40 nm. On the light-emitting layer, 2,2',2''-(1,3,5-benzenetriyl)-tris[3-(2-methylphenyl)-3H-imidazo[4,5-b]pyridine] as an electron transporting material was vapor-deposited at a rate of 1 nm/sec to form an electron transporting layer. A patterned mask (providing a luminescent area of 5 mm×5 mm) was placed on the resulting organic compound layer, on which lithium fluoride was vapor-deposited to a thickness of 1 nm, and then aluminum was vapor-deposited to a thickness of 100 nm to form a cathode in a vapor deposition apparatus. Furthermore, a ceramic sheet (thermal emissivity: 0.96, thickness: 300 µm) was attached to the opposite surface to the aluminum cathode surface having the organic compound layer. Aluminum lead wires were attached to the anode and the cathode to produce a light-emitting device. The organic EL layer was sealed to prevent the layer from being in contact with the external atmosphere. Thus, a light-emitting device according to the invention was obtained.

EXAMPLE 2

A light-emitting device was obtained in the same manner as in Example 1 except that a graphite sheet (PGS graphite sheet, thermal conductivity: 800 W/m·K) was used instead of the ceramic sheet.

EXAMPLE 3

A light-emitting device was obtained in the same manner as in Example 1 except that in Example 2, a ceramic sheet (thermal emissivity: 0.96, thickness: 300 µm, produced by Ceramission Co., Ltd.) was attached to the graphite sheet (PGS graphite sheet, thermal conductivity: 800 W/m·K) on the aluminum cathode.

EXAMPLE 4

A light-emitting device was obtained in the same manner as in Example 1 except that a moisture barrier film (having the constitution E in Table 1) produced by the following process steps 1 to 4 was used instead of the glass supporting substrate.

1. Formation of Inorganic Gas Barrier Layer

Figure 3:
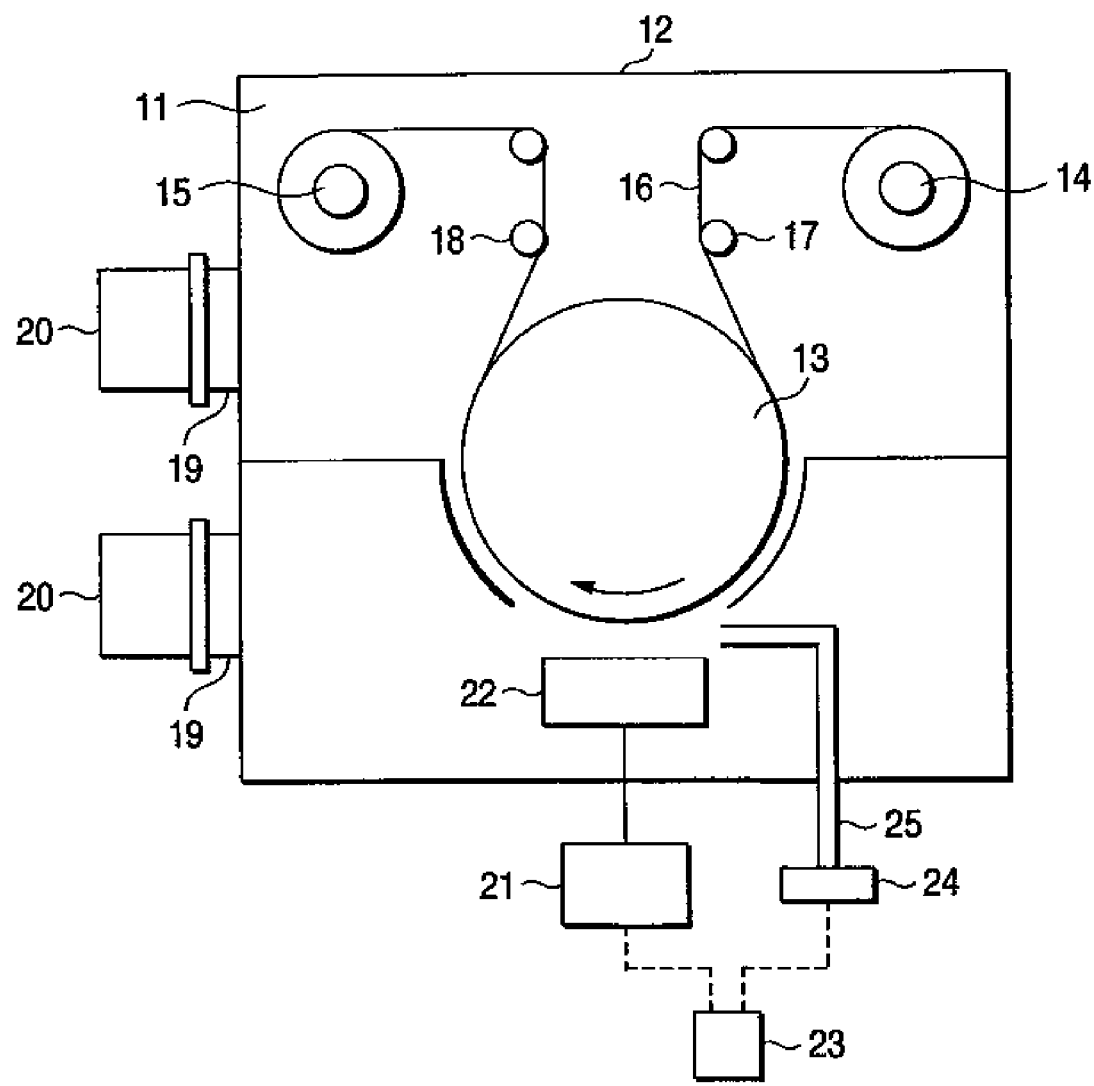
FIG. 3 is an illustrative view showing a sputtering apparatus used in Examples.

An inorganic gas barrier layer was formed on a substrate film by using a roll-to-roll type sputtering apparatus shown in FIG. 3. The substrate film used was a PEN film having a thickness of 500 µm excellent in flatness. As shown in FIG. 3, the sputtering apparatus 11 has a vacuum chamber 12, and in the central part thereof, a drum 13 for cooling a plastic film 16 by making in contact on the surface thereof. In the vacuum chamber 12, a feeding roll 14 and a winding roll 15 for winding the plastic film 16 were provided. The plastic film 16 wound on the feeding roll 14 was wound on the drum 13 through a guide roll 17, and then the plastic film 16 was wound on the winding roll 15 through a guide roll 18. As a vacuum evacuation system, the vacuum chamber 12 was continuously evacuated with a vacuum pump 20 through an exhaust outlet 19. As a film forming system, a target (not shown in the figure) was mounted on a cathode 22 connected to a direct current discharge power source 21 capable of applying pulse electric power. The discharge power source 21 was connected to a controller 23, and the controller 23 was connected to a gas flow rate controlling unit 24 for feeding a reaction gas to the vacuum chamber 12 through a piping 25 under adjustment of the introducing amount of the reaction gas. The vacuum chamber 12 was constituted in such a manner that a discharge gas was fed thereto at a constant flow rate (not shown in the figure).

The specific conditions for forming the inorganic gas barrier layer are shown below.

Si was set as a target, and a pulse application type direct current power source was used as the discharge power source 21. A substrate film (PET film) having a thickness of 100 µm was used as the plastic film 16, which was wound on the feeding roll 14 and hung through the winding roll 15. After completing preparation of the substrate film in the sputtering apparatus 11, the vacuum chamber 12 was closed and the vacuum pump 20 was started to evacuate the chamber and to cool the drum. After reaching the pressure of $4\times10^{-4}$ Pa and a drum temperature of 5° C., the plastic film 16 was started to run. Argon was introduced as a discharge gas, and the discharge power source 21 was turned on to carry out presputtering for 3 minutes by generating plasma on the Si target at a discharge electric power of 5 kW and a film forming pressure of 0.3 Pa. Thereafter, oxygen was introduced as a reaction gas, and after stabilizing discharge, the amounts of argon and oxygen were gradually decreased to reduce the film forming pressure to 0.1 Pa. After confirming stable discharge at 0.1 Pa, film formation with silicon oxide was carried out at a prescribed period of time. After completing the film formation, the vacuum chamber 12 was returned to the atmospheric pressure, and the film having silicon oxide (inorganic gas barrier layer) was take out. The thickness of the inorganic gas barrier layer was about 50 nm. Upon forming an inorganic gas barrier layer on the hygroscopic layer or the organic layer according to the structures shown in Table 1 below, the inorganic barrier layer was formed in the same manner as above.

TABLE 1

| Constitution | Contents (thickness) |
|---|---|
| A | substrate film/SiO$_x$ (50 nm)/organic layer (500 μm)/SiO$_x$ (50 nm)/organic layer (500 μm) |
| B | substrate film/SiO$_x$ (50 nm)/organic layer (500 μm)/hygroscopic layer/organic layer (500 μm)/SiO$_x$ (50 nm)/organic layer (500 μm) |
| C | substrate film/SiO$_x$ (50 nm)/organic layer (500 μm)/hygroscopic layer/(organic layer (500 μm/SiO$_x$ (50 nm)) × 2/organic layer (500 μm) |
| D | substrate film/(SiO$_x$ (50 nm)/organic layer (500 μm)) × 2/hygroscopic layer/(organic layer (500 μm)/SiO$_x$ (50 nm)) × 2 |
| E | IZO (20 nm)/substrate film/(SiO$_x$ (50 nm)/organic layer (500 μm)) × 2/hygroscopic layer/(organic layer (500 μm)/SiO$_x$ (50 nm)) × 2 |
| F | substrate film/(SiO$_x$ (50 nm)/organic layer (500 μm)) × 2/hygroscopic layer/organic layer (500 μm) |
| G | substrate film/hygroscopic layer/organic layer (500 μm)/(SiO$_x$ (50 nm)/organic layer (500 μm)) × 2 |

"SiOx" represents the inorganic gas barrier layer, and "IZO" represents an antistatic layer.

2. Formation of Organic Layer

A acrylic monomer mixture of 50.75 mL of tetraethylene glycol diacrylate, 14.5 mL of tripropylene glycol monoarcylate, 7.25 mL of caprolactone acrylate, 10.15 mL of acrylic acid and 10.15 mL of EZACURE (a benzophenone mixed photopolymerization initiator, produced by Startomer) was mixed with 36.25 g of N,N'-bis(3-methylphenyl)-N,N'-diphenylbenzidine particles as a solid matter, and the mixture was agitated with a 20 kHz ultrasonic tissue mincer for about 1 hour. The mixture was heated to about 45° C. and stirred for preventing sedimentation, and was fed to a spray nozzle of 1.3 mm with a pump through a capillary having an inner diameter of 2.0 mm and a length of 61 mm. The mixture was sprayed into minute droplets with a 25 kHz ultrasonic sprayer and attached to the surface of the inorganic gas barrier layer or the hygroscopic layer maintained at about 340° C. Subsequently, the substrate film having the gas barrier layer or the hygroscopic layer was made in contact with the low temperature drum having a surface temperature of about 13° C., and vapor was condensed on the gas barrier layer or the hygroscopic layer, followed by curing with an ultraviolet ray with a high-pressure mercury lamp (accumulated irradiation amount: 2,000 mJ/cm$^2$), to form an organic layer. The thickness of the organic layer was about 500 nm.

3. Formation of Hygroscopic Layer

On the inorganic gas barrier layer or the organic layer, presputtering was carried out by using a target containing strontium peroxide, calcium peroxide and barium peroxide (produced by Toyoshima MFG Co., Ltd.) with Ar gas introduced at a discharge electric power of 100 W and a film forming pressure of 0.8 Pa for 3 minutes, and then film formation was carried out. The resulting hygroscopic layer had a thickness of about 20 nm, and elemental analysis thereof revealed that the ratio of Sr and O, the ratio of Ca and O, and the ratio of Ba and O were all about 1/1. In the constitution G in Table 1, the hygroscopic layer was provided directly on the substrate film.

For comparison, film formation was carried out by using a combination of the aforementioned SrO$_2$ target and SiO$_2$ target by using an RF electric power source at a discharge electric power of 100 W and a film forming pressure of 0.8 Pa. The compositional ratio of Sr and Si was about 1/1, and the thickness of the film was about 40 nm.

4. Formation of Moisture Barrier Film

On the side of the hygroscopic layer opposite to the substrate film, a moisture barrier film containing three layers, i.e., an inorganic gas barrier layer, an organic layer and an inorganic gas barrier layer, was formed by the method shown in the aforementioned items 1 and 2 (constitution E in Table 1).

EXAMPLE 5

A light-emitting device was obtained in the same manner as in Example 2 except that the moisture barrier film used in Example 4 was used instead of the glass substrate in Example 2.

EXAMPLE 6

A light-emitting device was obtained in the same manner as in Example 3 except that the moisture barrier film (PEN) used in Example 4 was used instead of the glass substrate in Example 3.

EXAMPLE 7

A light-emitting device was obtained in the same manner as in Example 4 except that a high heat resistance and low retractility substrate film produced in the following manner was used instead of the PEN film as the substrate film in Example 4.

1. Production of High Heat Resistance and Low Retractility Film

The resin compound (1-1) was dissolved in dichloromethane to a concentration of 15% by mass, and the resulting solution was flow-cast on a stainless steel band by the die coating method. The resulting primary film was peeled off from the band and then dried to a remaining solvent concentration of 0.08% by mass. After drying, the primary film was slit on both sides thereof and subjected to a knurling treatment, followed by winding, to produce a high heat resistance and low retractility film having a thickness of 100 μm.

EXAMPLE 8

A light-emitting device was obtained in the same manner as in Example 5 except that a high heat resistance and low retractility substrate film produced in the manner shown in Example 7 was used instead of the PEN film as the substrate film in Example 5.

EXAMPLE 9

A light-emitting device was obtained in the same manner as in Example 6 except that a high heat resistance and low retractility substrate film produced in the manner shown in Example 7 was used instead of the PEN film as the substrate film in Example 6.

COMPARATIVE EXAMPLE 1

A light-emitting device was obtained in the same manner as in Example 1 except that the ceramic sheet was not attached to the aluminum cathode.

COMPARATIVE EXAMPLE 2

A light-emitting device was obtained in the same manner as in Example 1 except that a ceramic sheet (thermal emissivity: 0.5, thickness: 40 μm) was attached to the aluminum cathode.

COMPARATIVE EXAMPLE 3

A light-emitting device was obtained in the same manner as in Example 1 except that a graphite sheet (PGS graphite sheet, thermal conductivity: 100 W/m·K) was attached to the aluminum cathode.

COMPARATIVE EXAMPLE 4

A light-emitting device was obtained in the same manner as in Comparative Example 1 except that the moisture barrier film (PEN) used in Example 4 was used instead of the glass substrate in Comparative Example 1.

COMPARATIVE EXAMPLE 5

A light-emitting device was obtained in the same manner as in Comparative Example 1 except that a moisture barrier film (having a high heat resistance and low retractility substrate film) produced in the manner shown in Example 7 was used instead of the glass substrate in Comparative Example 1.

The light-emitting devices thus produced were evaluated in the following manner. A direct current voltage was applied to the organic EL device by using Source-Measure Unit Model 2400 (produced by Toyo Technica Inc.) to carry out luminescence. The maximum luminance is represented by Lmax, and the voltage providing Lmax was represented by Vmax.

The device was driven in an environment of an ambient temperature of 20° C. and a relative humidity of 60%. The relative luminance after continuously driving for 1,000 hours with respect to the initial luminance is shown in Table 2.

It is understood that Example 2 according to the invention using the graphite sheet as a heat radiation material is improved in relative luminance twice or less as compared to Comparative Example 1. It is also understood that Comparative Example 3 using the graphite sheet having a thermal conductivity of 100 W/m·K fails to provide the significant improvement in relative luminance obtained in Example 2.

It is understood that Example 3 according to the invention using the graphite sheet and the ceramic sheet in combination as a heat radiation material exhibits significant improvement in relative luminance that is excellent in comparison to the cases where the sheets are used solely.

It is understood that Example 4 having the same constitution as in Example 1 but using the moisture barrier film (PEN) is used as a substrate is improved in relative luminance about twice as compared to Comparative Example 4 using no heat radiation material. It is also understood that Comparative Example 4 using the moisture barrier film (PEN) is used as a

TABLE 2

| | Heat radiation material on back electrode | Substrate | Sealing | Lmax (Cd/m$^2$) | Vmax (V) | Relative luminance |
|---|---|---|---|---|---|---|
| Example 1 | ceramic sheet (thermal emissivity: 0.96, thickness: 300 μm) | glass | glass | 20,000 | 10 | 80% |
| Example 2 | graphite sheet (thermal conductivity: 800 W/m · K) | glass | glass | 20,000 | 9.5 | 70% |
| Example 3 | graphite sheet (thermal conductivity: 800 W/m · K) + ceramic sheet (thermal emissivity: 0.96, thickness: 300 μm) | glass | glass | 20,000 | 9.5 | 90% |
| Example 4 | ceramic sheet (thermal emissivity: 0.96, thickness: 300 μm) | moisture barrier film | moisture barrier film | 20,000 | 11 | 72% |
| Example 5 | graphite sheet (thermal conductivity: 800 W/m · K) | moisture barrier film | moisture barrier film | 20,000 | 10.5 | 64% |
| Example 6 | graphite sheet (thermal conductivity: 800 W/m · K) + ceramic sheet (thermal emissivity: 0.96, thickness: 300 μm) | moisture barrier film | moisture barrier film | 20,000 | 10.5 | 82% |
| Example 7 | ceramic sheet (thermal emissivity: 0.96, thickness: 300 μm) | moisture barrier film (high heat resistance and low retractility base) | moisture barrier film (high heat resistance and low retractility base) | 20,000 | 11 | 81% |
| Example 8 | graphite sheet (thermal conductivity: 800 W/m · K) | moisture barrier film (high heat resistance and low retractility base) | moisture barrier film (high heat resistance and low retractility base) | 20,000 | 10.5 | 73% |
| Example 9 | graphite sheet (thermal conductivity: 800 W/m · K) + ceramic sheet (thermal emissivity: 0.96, thickness: 300 μm) | moisture barrier film (high heat resistance and low retractility base) | moisture barrier film (high heat resistance and low retractility base) | 20,000 | 10.5 | 90% |
| Comparative Example 1 | none | glass | glass | 20,000 | 10 | 40% |
| Comparative Example 2 | ceramic sheet (thermal emissivity: 0.5, thickness: 40 μm) | glass | glass | 20,000 | 10 | 44% |
| Comparative Example 3 | graphite sheet (thermal conductivity: 100 W/m · K) | glass | glass | 20,000 | 9.5 | 43% |
| Comparative Example 4 | none | moisture barrier film | moisture barrier film | 20,000 | 11 | 35% |
| Comparative Example 5 | none | moisture barrier film (high heat resistance and low retractility base) | moisture barrier film (high heat resistance and low retractility base) | 20,000 | 11 | 40% |

It is understood that Example 1 according to the invention using the ceramic sheet as a heat radiation material is improved in relative luminance twice as compared to Comparative Example 1. It is also understood that Comparative Example 2 using the ceramic sheet having a thickness of 40 μm fails to provide the significant improvement in relative luminance obtained in Example 1.

substrate suffers severe deterioration in relative luminance as compared to Comparative Example 1 using the glass substrate. It is considered that this is because of shortage in heat radiation of the film substrate having lower heat radiation property than the glass substrate. It is understood that the problem is apparently solved by applying the heat radiation plate according to the invention.

It is understood that Examples 5 and 6 according to the invention exhibit improvement in relative luminance as compared to Comparative Example 4. It is considered from the results that the shortage in heat radiation of the film substrate is significantly improved. A larger improvement effect is found in Example 6.

It is understood that Example 7 according to the invention having the same constitution as in Example 4 but using the moisture barrier film (high heat resistance and low retractility base) is used as a substrate is improved in relative luminance about twice as compared to Comparative Example 5. It is also understood that Example 7 is improved in relative luminance about 10% as compared to Example 4. It is considered that this is because the PEN substrate is slightly lowered in moisture barrier property upon elongation and contraction of the film due to the shortage in heat radiation of the film substrate, but the high heat resistance and low retractility film substrate can suppress deterioration in barrier property due to the heat.

It is understood that Example 8 and 9 according to the invention exhibit improvement in relative luminance as similar to Example 7. A larger improvement effect is found in Example 9.

It will be apparent to those skilled in the art that various modifications and variations can be made to the described embodiments of the invention without departing from the spirit or scope of the invention. Thus, it is intended that the invention cover all modifications and variations of this invention consistent with the scope of the appended claims and their equivalents.

The present application claims foreign priority based on Japanese Patent Application No. JP2005-80116 filed Mar. 18 of 2005, the contents of which are incorporated herein by reference.

What is claimed is:

1. An organic electroluminescent device comprising:
    a back electrode;
    at least one transparent electrode;
    at least one light-emitting layer between the back electrode and the at least one transparent electrode;
    a graphite sheet having a thermal conductivity of 200 W/m·K or more, the graphite sheet being disposed on a side of the back electrode opposite to the at least one light-emitting layer and adjacent to the back electrode; and
    a ceramic sheet having a thermal emissivity of 0.8 or more and a thickness of from 50 to 1000 μm, the ceramic sheet being disposed adjacent to the graphite sheet;
    wherein the content of carbon atoms in said graphite sheet is 98.0% by mass or more.

2. The organic electroluminescent device according to claim 1, wherein the ceramic sheet comprises:
    a substrate; and
    a coated film containing at least one of sodium silicate and potassium silicate.

3. The organic electro luminescent device according to claim 1, wherein the graphite sheet is a highly oriented graphite sheet.

4. The organic electroluminescent device according to claim 1, wherein the graphite sheet has a thickness of from 50 μm to 5 mm.

5. The organic electroluminescent device according to claim 1, which comprises a moisture barrier film, the moisture barrier film comprising: a substrate film; at least two inorganic gas barrier layers; and at least one hygroscopic layer between the at least two inorganic gas barrier layers, the at least one hygroscopic layer containing an oxide of an alkaline earth metal.

* * * * *